United States Patent
Barak et al.

(10) Patent No.: US 6,825,719 B1
(45) Date of Patent: Nov. 30, 2004

(54) RF POWER AMPLIFIER AND METHODS FOR IMPROVING THE EFFICIENCY THEREOF

(75) Inventors: Ilan Barak, Kfar Saba (IL); Jaime Hasson, Gane Tikva (IL); Doron Rainish, Ramat Gan (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/579,528

(22) Filed: May 26, 2000

(51) Int. Cl.$^7$ .............................................. H03G 3/20
(52) U.S. Cl. .................................. 330/129; 330/124 R
(58) Field of Search .......................... 330/107, 124 R, 330/129, 136, 124; 455/126, 127

(56) References Cited

U.S. PATENT DOCUMENTS

| | | | |
|---|---|---|---|
| 3,777,275 A | 12/1973 | Cox | |
| 4,433,312 A | 2/1984 | Kahn | |
| 4,439,744 A | 3/1984 | Kumar et al. | |
| 5,012,200 A * | 4/1991 | Meinzer | 330/124 R |
| 5,264,807 A | 11/1993 | Okubo et al. | |
| 5,302,914 A * | 4/1994 | Arntz et al. | 330/129 |
| 5,345,189 A | 9/1994 | Hornak et al. | |
| 5,420,541 A | 5/1995 | Upton et al. | |
| 5,541,554 A | 7/1996 | Stengel et al. | |
| 5,548,246 A | 8/1996 | Tamamoto et al. | |
| 5,568,094 A | 10/1996 | Bowen et al. | |
| 5,621,351 A | 4/1997 | Puri et al. | |
| 5,661,434 A | 8/1997 | Brozovich et al. | |
| 5,694,093 A * | 12/1997 | DaSilva et al. | 455/102 |
| 5,724,005 A | 3/1998 | Chen et al. | |
| 5,739,723 A | 4/1998 | Sigmon et al. | |
| 5,758,269 A | 5/1998 | Wu | |
| 5,786,727 A | 7/1998 | Sigmon | |
| 5,854,571 A * | 12/1998 | Pinckley et al. | 330/129 |
| 5,862,460 A * | 1/1999 | Rich | 455/126 |
| 5,872,481 A * | 2/1999 | Sevic et al. | 330/124 R |
| 5,880,633 A | 3/1999 | Leizerovich et al. | |
| 5,886,575 A | 3/1999 | Long | |
| 5,901,346 A | 5/1999 | Stengel et al. | |
| 5,903,854 A * | 5/1999 | Abe et al. | 330/124 R |
| 5,909,643 A | 6/1999 | Aihara | |
| 5,929,702 A | 7/1999 | Myers et al. | |
| 5,974,041 A | 10/1999 | Kornfeld et al. | |
| 6,133,788 A * | 10/2000 | Dent | 330/124 R |
| 6,201,452 B1 * | 3/2001 | Dent et al. | 330/124 R |
| 6,285,251 B1 | 9/2001 | Dent et al. | |
| 6,330,455 B1 * | 12/2001 | Ichihara | 455/126 |

FOREIGN PATENT DOCUMENTS

WO    WO99/52206    10/1999

OTHER PUBLICATIONS

U.S. patent application Ser. No. 09/769,444, Barak et al., filed Jan. 26, 2001.

U.S. patent application Ser. No. 10/026,677, Hasson et al., filed Dec. 27, 2001.

(List continued on next page.)

Primary Examiner—Khanh Van Nguyen
(74) Attorney, Agent, or Firm—Eitan, Pearl, Latzer & Cohen Zedek, LLP

(57) ABSTRACT

A radio frequency power amplifier characterized by an efficiency and operative to produce an output signal at a desired output power includes an outphasing system with shunt reactance and a controller. The outphasing system with shunt reactance has a variable phase and is operative to produce the output signal from an input signal. The controller is operative to control the variable phase and the amplitude of the input signal in order to achieve high efficiency at low desired output powers. A method for controlling the output power of a radio frequency power amplifier includes reducing the power of an input signal to the power amplifier when a desired output power is below a threshold and performing outphasing when the desired output power is not below the threshold.

35 Claims, 6 Drawing Sheets

OTHER PUBLICATIONS

D.C. Cox, "Linear Amplification with Nonlinear Components", IEEE Transaction on Communications, Dec. 1974, pp. 1942–1945.

Bob Stengel and William R. Eisenstadt, "LINC Power Amplifier Combiner Method Efficiency Optimization", IEEE Transaction on Vehicular Technology, vol. 49, No. 1, Jan. 2000, pp. 229–234.

Bob Stengel, "LINC Linear Transmitter Technology Review", Presented at International Microwave Symposium, Boston, MA, Jun. 11, 2000, pp. 1–32.

S. O. Ampem–Darko, H.S. Al–Raweshidy, "A Novel Technique for Gain/Phase Error Cancellation in LINC Transmitters", 1999 IEEE, pp. 2034–2038.

Fredrick H. Raab, "Efficiency of Outphasing RF PowerAmplifier Systems", IEEE Transaction on Communications. Oct. 1985, pp. 1094–1099, vol. Com–33, No. 10.

Steve C. Cripps, "RF Amplifiers for Wireless Communications", 1999, USA.

* cited by examiner

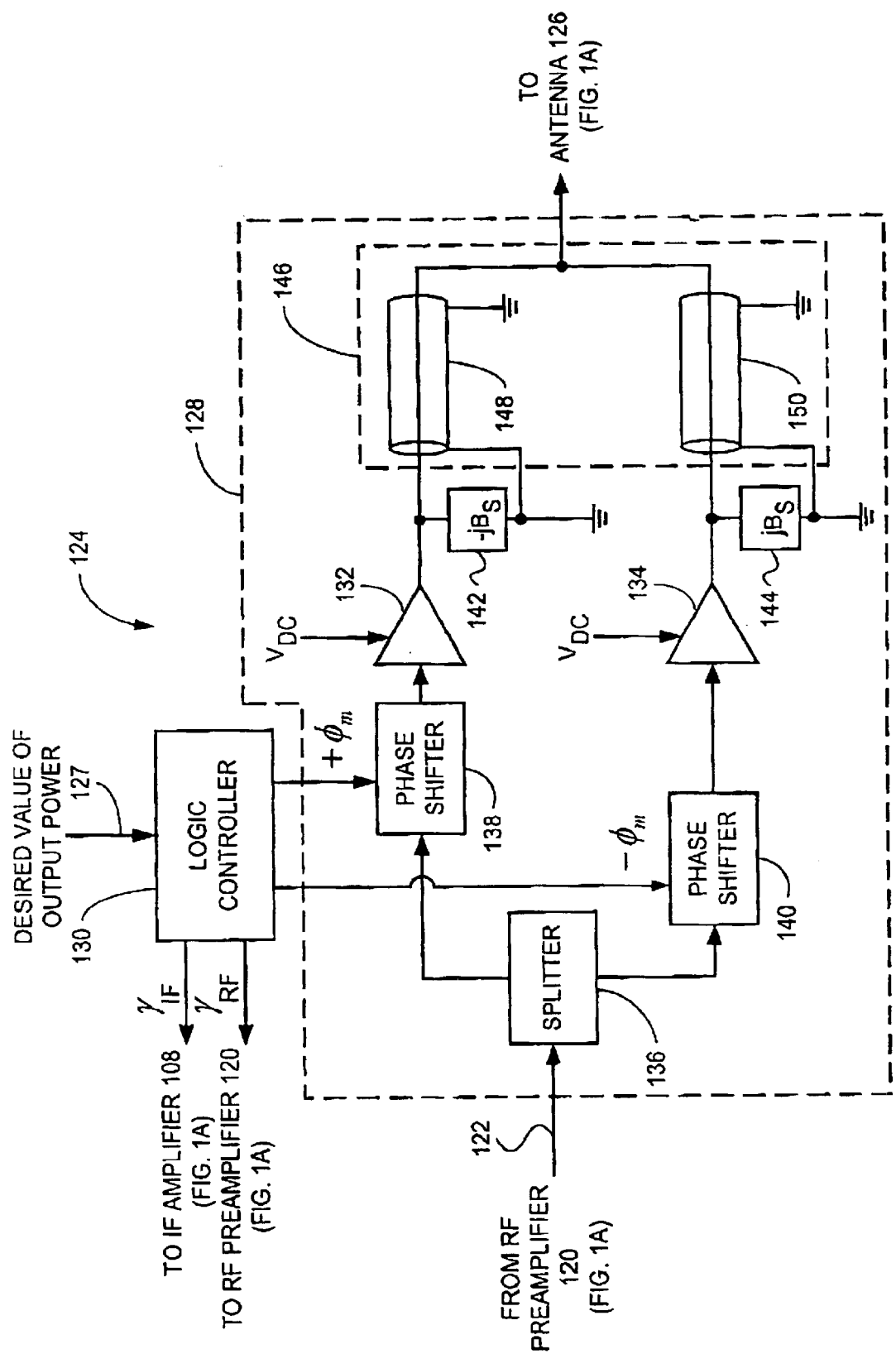

RF POWER AMPLIFIER AND METHODS FOR IMPROVING THE EFFICIENCY THEREOF

BACKGROUND OF THE INVENTION

A typical radio transmitter uses a radio frequency (RF) power amplifier to amplify outbound signals for transmission by an antenna. A linear power amplifier receives a signal at an input power and produces the signal at an output power, which is the input power amplified by a gain. The linear power amplifier is driven by a direct current (DC) input voltage, provided for example by a battery in the transmitter, and the efficiency of the power amplifier is given by the ratio of the output power to the DC input power. RF power amplifiers are generally designed to provide maximum efficiency at the maximal output power. When the power amplifier produces an output power that is less than the maximal output power, the efficiency of the power amplifier may be significantly reduced.

There are several situations where the output power of an RF transmitter needs to be less than the maximal output power ("power control"). For example, in amplitude modification (AM) radio transmission, the instantaneous output power is set according to the instantaneous strength of the modulating audio to be transmitted. In the case of battery-operated portable handsets such as cellular telephones and pagers, the power amplifier is one of the main current consumption elements, and power control is used in order to prolong the lifetime of the battery. Power control is also used to reduce interference between different calls in the same vicinity and to reduce the radiation emitted by the handset. In fact, modern cellular systems allow handset transmission at low power for long periods of time.

However, since the efficiency of the power amplifier is significantly reduced when the power amplifier produces an output power that is less than the maximal output power, more battery power at lower output power is actually consumed. It would therefore be beneficial to improve the efficiency of the RF power amplifier at lower output powers without reducing the efficiency at the maximal output power.

BRIEF DESCRIPTION OF THE DRAWINGS

The present invention will be understood and appreciated more fully from the following detailed description taken in conjunction with the appended drawings in which:

FIGS. 1A and 1B are a schematic illustration of an exemplary radio frequency (RF) transmitter including an exemplary power amplifier, according to an embodiment of the invention;

DETAILED DESCRIPTION OF THE PRESENT INVENTION

Embodiments of the present invention are directed to a radio frequency (RF) power amplifier. Embodiments of the present invention are also directed to a method for controlling the output power of a radio frequency amplifier.

Figure 1A:
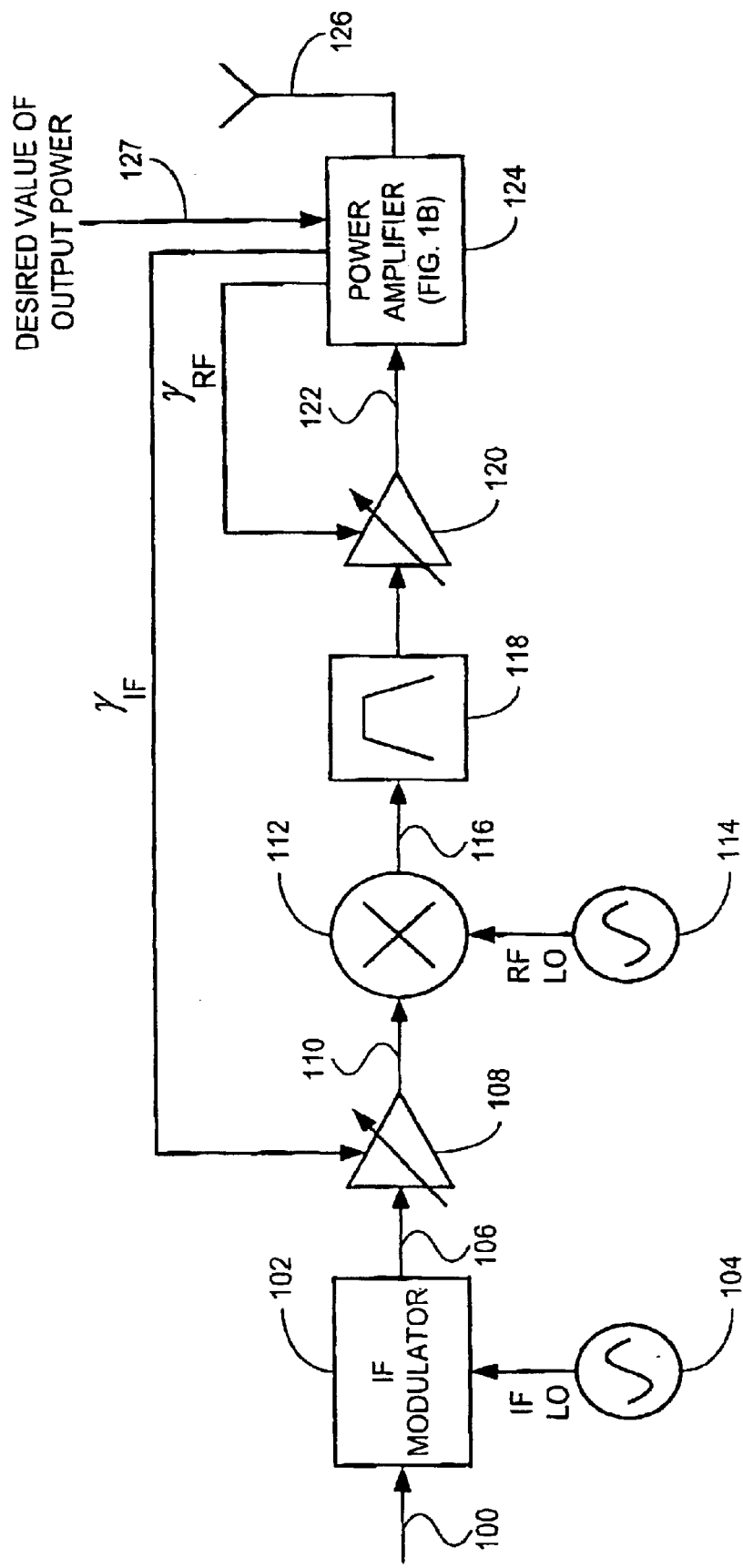

Up-conversion from baseband frequencies to radio frequencies involves an up-conversion chain, which includes a chain of amplifiers and preamplifiers interspersed with modulators, mixers and bandpass filters. Reference is now made to FIGS. 1A and 1B, which are a schematic illustration of an exemplary radio frequency (RF) transmitter including an exemplary power amplifier, according to an embodiment of the present invention. A baseband modulation signal 100 may be provided to an intermediate frequency (IF) modulator 102. IF modulator 102 may receive an IF local oscillator (LO) signal from an IF local oscillator (LO) 104. IF modulator 102 may modulate the IF LO signal with baseband modulation signal 100, thus producing an IF modulated signal 106. IF modulated signal 106 may be provided to an IF amplifier 108, which may amplify it by a gain $y_{IF}$, thus producing an amplified IF modulated signal 110. A mixer 112 may receive an RF LO signal from an RF local oscillator 114. Mixer 112 may mix the RF LO signal with signal 110, thus producing an RF signal 116. RF signal 116 may be filtered by a bandpass filter 118, and then provided to an RF preamplifier 120, which may amplify it by a gain $y_{RF}$ thus producing an RF signal 122. RF signal 122 may be provided to a power amplifier 124, which may amplify it to an output power for transmission by an antenna 126. Either IF amplifier 108 or RF preamplifier 120, or both, have a variable gain ($y_{IF}$ and/or $y_{RF}$) that can be controlled by power amplifier 124 according to the desired value of the output power. The controller of the radio transmitter may provide the desired value of the output power to power amplifier 124, as indicated by arrow 127.

Power amplifier 124 is shown in detail in FIG. 1B. Power amplifier 124 comprises an outphasing system 128 with shunt reactance and a logic controller 130. The input to outphasing system 128 is RF signal 122. The amplitude of RF signal 122 may be determined by many factors, among them the modulation and the gain of IF amplifier 108 and RF preamplifier 120.

Outphasing systems with shunt reactance (commonly known as Chireix outphasing systems) are known in the art. An example is described in F. Raab, "Efficiency of Outphasing RF Power-Amplifier Systems", *IEEE Transactions on Communications*, vol. COM-33, No. 10, October 1985. The Chireix outphasing system was designed in 1935 to improve the efficiency and linearity of AM broadcast transmitters. It comprises a transmission-line-coupler with shunt reactance. An outphasing system with shunt reactance achieves maximal efficiency for two values of the output power.

Outphasing system 128 comprises two branch amplifiers 132 and 134 connected in parallel and a splitter 136 for splitting RF signal 122, so that a signal with half the input power is provided to branch amplifier 132 and a signal with half the input power is provided to branch amplifier 134. Branch amplifiers 132 and 134 are driven by a DC input voltage $V_{DC}$. Outphasing system 128 also comprises phase shifters 138 and 140 for modifying the phase of RF signal 122 provided to branch amplifiers 132 and 134, respectively. Outphasing system 128 may include shunt reactance elements 142 and 144 at the output of branch amplifiers 132 and 134, respectively. $B_S$ is the shunt reactance of element 142 and $-B_S$ is the shunt reactance of element 144. Through proper selection of the shunt reactance $B_S$, the efficiency may be maximized at a specific output power. The efficiency of a specific output power may be improved by the adjusting of the shunt reactance $B_S$.

Outphasing system 128 may also comprise a transmission-line-coupler 146 for combining the outputs of branch amplifiers 132 and 134. Transmission-line-coupler 146 comprises two transmission lines 148 and 150, each of which serves as an impedance inverter connected to antenna 126 so that the sum of the branch currents goes through the load. Other combiner schemes yielding the same performance could be implemented instead, namely Hybrid BALUN or center tap inductor.

Logic controller 130 controls the output power of power amplifier 124 according to the desired value of the output power. Logic controller 130 controls the output power of the power amplifier by utilizing two methods of power control. For a first range of output powers, for example 15 dB, logic controller 130 performs outphasing. Logic controller 130 may vary the phase of outphasing system 128 in order that outphasing system 128 provides antenna 126 with a signal at an output power according to the desired value. For a second range of output powers, logic controller 130 varies the amplitude of RF signal 122, which is the input to outphasing system 128. The operation of logic controller 130 is better understood if reference is made additionally to FIGS. 2A and 2B.

Figure 2A:
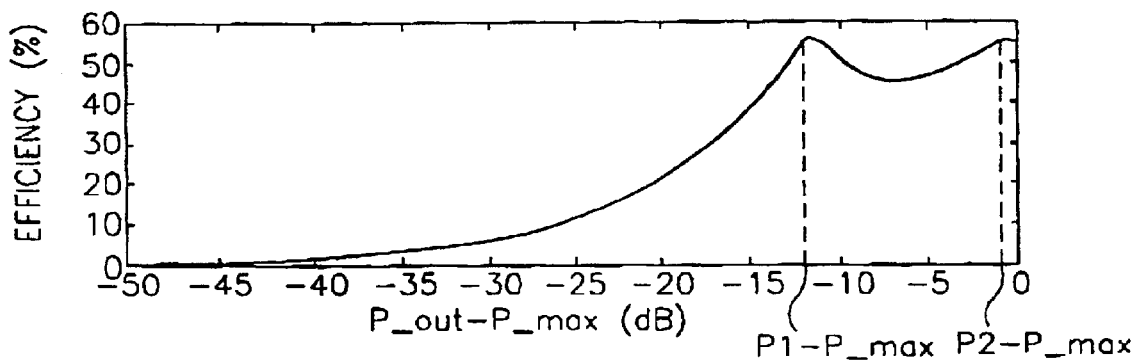
FIG. 2A is a graphical illustration of the efficiency η of the RF transmitter of FIGS. 1A and 1B as a function of the normalized output power.

FIG. 2A is a graphical illustration of the efficiency η of the RF transmitter of FIGS. 1A and 1B as a function of the normalized output power. The outphasing system with shunt reactance has a peak efficiency at P1, and a peak efficiency at P2. When the desired output power is at or greater than a threshold, namely P1, logic controller 130 performs outphasing, setting the phase $\phi_m$ so that outphasing system 128 applies +$\phi_m$ to phase shifter 138 and –$\phi_m$ to phase shifter 140, thus producing an output power according to the desired value. It can be seen that when the output power is at or greater than P1, the efficiency of the RF transmitter of FIGS. 1A and 1B is the same as that of a pure Chireix outphasing system.

For the range of output powers below threshold P1, logic controller 130 keeps the phase $\phi_m$ constant at $\phi_{m-MAX}$ and reduces the gain ($y_{IF}$ and/or $y_{RF}$) of IF amplifier 108 or RF preamplifier 120 or both, thus reducing the amplitude of RF signal 122, which is the input to outphasing system 128. It can be seen that at the range of output powers below threshold P1, the efficiency of the RF transmitter of FIGS. 1A and 1B is significantly improved with respect to both the class-B power amplifiers and a pure Chireix outphasing system.

It will be appreciated by persons of ordinary skill in the art that IF amplifier 108 could be replaced by a series of IF amplifiers, at least one of which has variable gain which is controlled by logic controller 130 when the desired output power is lower than P1. Similarly, it will be appreciated that RF preamplifier 120 could be replaced by a series of RF preamplifiers, at least one of which has variable gain which is controlled by logic controller 130 when the desired output power is lower than P1. In general, any serial combination of IF amplifiers prior to mixer 112 and any serial combination of RF preamplifiers prior to power amplifier 124 could be used, provided that at least one of the IF amplifiers and RF preamplifiers has variable gain which is controlled by logic controller 130 when the desired output power is lower than P1.

Figure 2B:
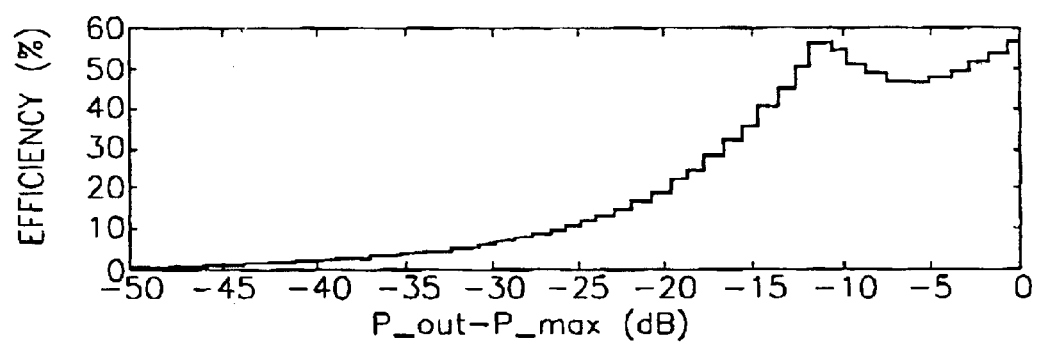
FIG. 2B is a graphical illustration of the efficiency η of the RF transmitter of FIGS. 1A and 1B as a function of the normalized output power when the phase shifts have discrete values.

In another example of the present invention, the phase shifts +$\phi_m$ and –$\phi_m$ provided by the logic controller to the phase shifters do not vary continuously between $\phi_{m-MIN}$ and $\phi_{m-MAX}$, but set the phase to a value from a collection of discrete phase values. FIG. 2B is a graphical illustration of the efficiency η of the RF transmitter of FIGS. 1A and 1B as a function of the normalized output power when the phase shifts have discrete values.

Figure 3:
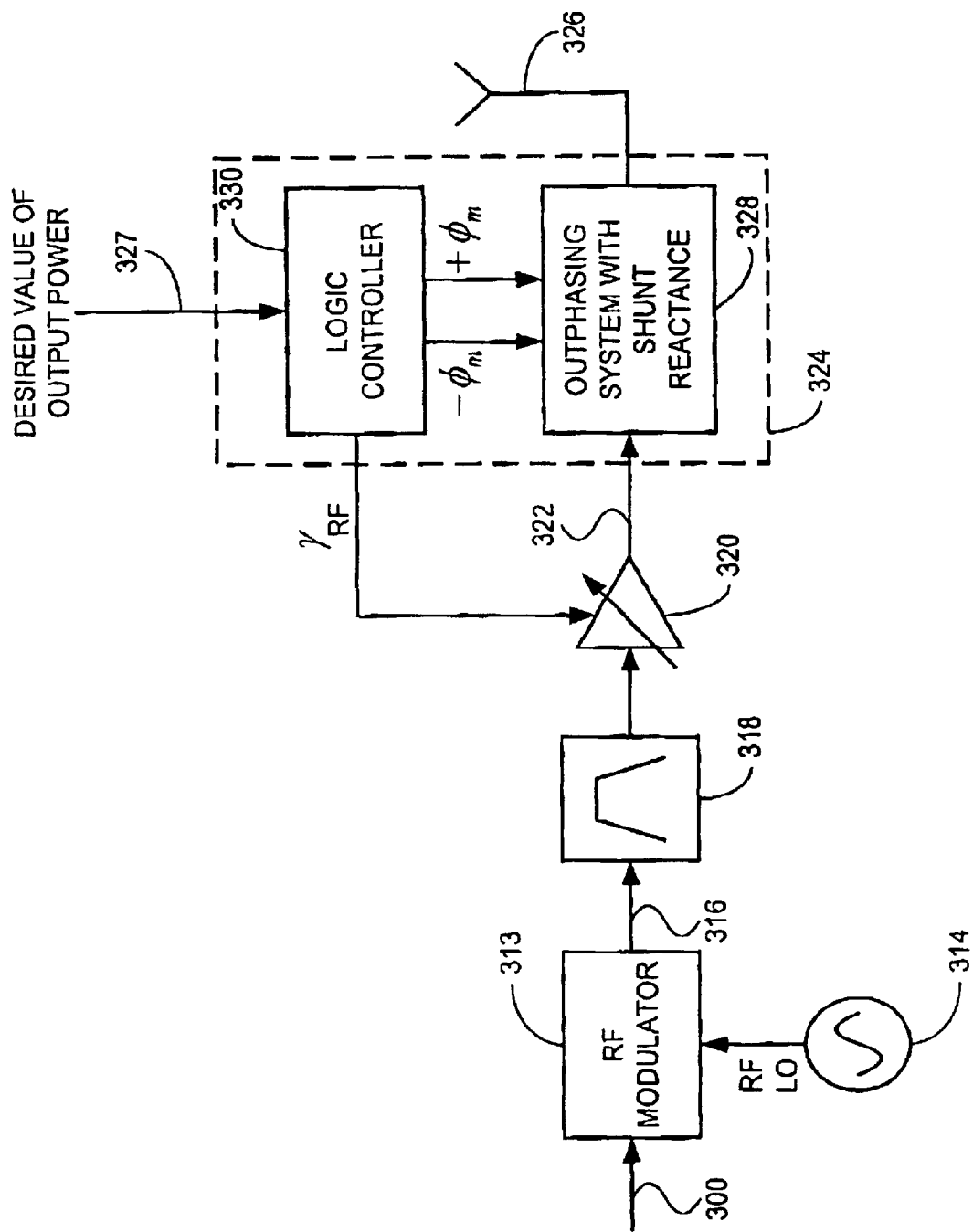
FIG. 3 is a schematic illustration of another exemplary RF transmitter including another exemplary power amplifier, according to an embodiment of the invention.

Reference is now made to FIG. 3, which is a schematic illustration of another exemplary RF transmitter including an exemplary power amplifier, according to an embodiment of the present invention. A baseband modulation signal 300 may be provided to an RF modulator 313. RF modulator 313 may receive an RF LO signal from an RF local oscillator 314. RF modulator 313 may modulate the RF LO signal with baseband modulation signal 300, thus producing an RF signal 316. RF signal 316 may be filtered by a bandpass filter 318, and then may be provided to a chain of at least one RF preamplifier 320, which may amplify it by a gain $y_{RF}$ thus producing an RF signal 322. RF signal 322 may be provided to a power amplifier 324, which may amplify it to an output power for transmission by an antenna 326. At least one of the RF preamplifiers 320 may have a variable gain ($y_{RF}$) that is controlled by power amplifier 324 according to the desired value of the output power. The controller of the radio transmitter may provide the desired value of the output power to power amplifier 324, as indicated by arrow 327.

Power amplifier 324 may comprise an outphasing system 328 with shunt reactance and a logic controller 330. The input to outphasing system 328 is RF signal 322. The amplitude of RF signal 322 is determined by many factors, among them the modulation and the gain of RF preamplifier 320. Outphasing system 328 may be the same as or similar to outphasing system 128 of FIG. 1B and will not be described further.

Logic controller 330 may control the output power of power amplifier 324 according to the desired value of the output power. Referring again briefly to FIG. 2A, when the desired value of the output power is at or greater than a threshold, namely P1, logic controller 330 performs outphasing, setting the phase $\phi_m$ so that outphasing system 328 provides antenna 126 with a signal at an output power according to the desired value. It can be seen that when the output power is at or greater than P1, the efficiency of the RF transmitter of FIG. 3 is the same as that of a pure Chireix outphasing system. For desired output powers lower than P1, logic controller 330 may keep the phase $\phi_m$ constant at $\phi_{m-MAX}$ and varies the gain ($y_{RF}$) of at least one of the variable gain RF preamplifiers 320, thus reducing the amplitude of RF signal 322, which is the input to outphasing system 328. It can be seen that at output powers lower than threshold P1, the efficiency of the RF transmitter of FIG. 3 is is significantly improved with respect to both the class-B power amplifiers and a pure Chireix outphasing system.

According to another aspect of the present invention, the logic controller sets the gain of at least one of the IF amplifiers and the RF preamplifiers even when the desired value of the output power is at or above threshold P1 in order to improve the efficiency of the outphasing system 128 and/or 328.

Figure 4:
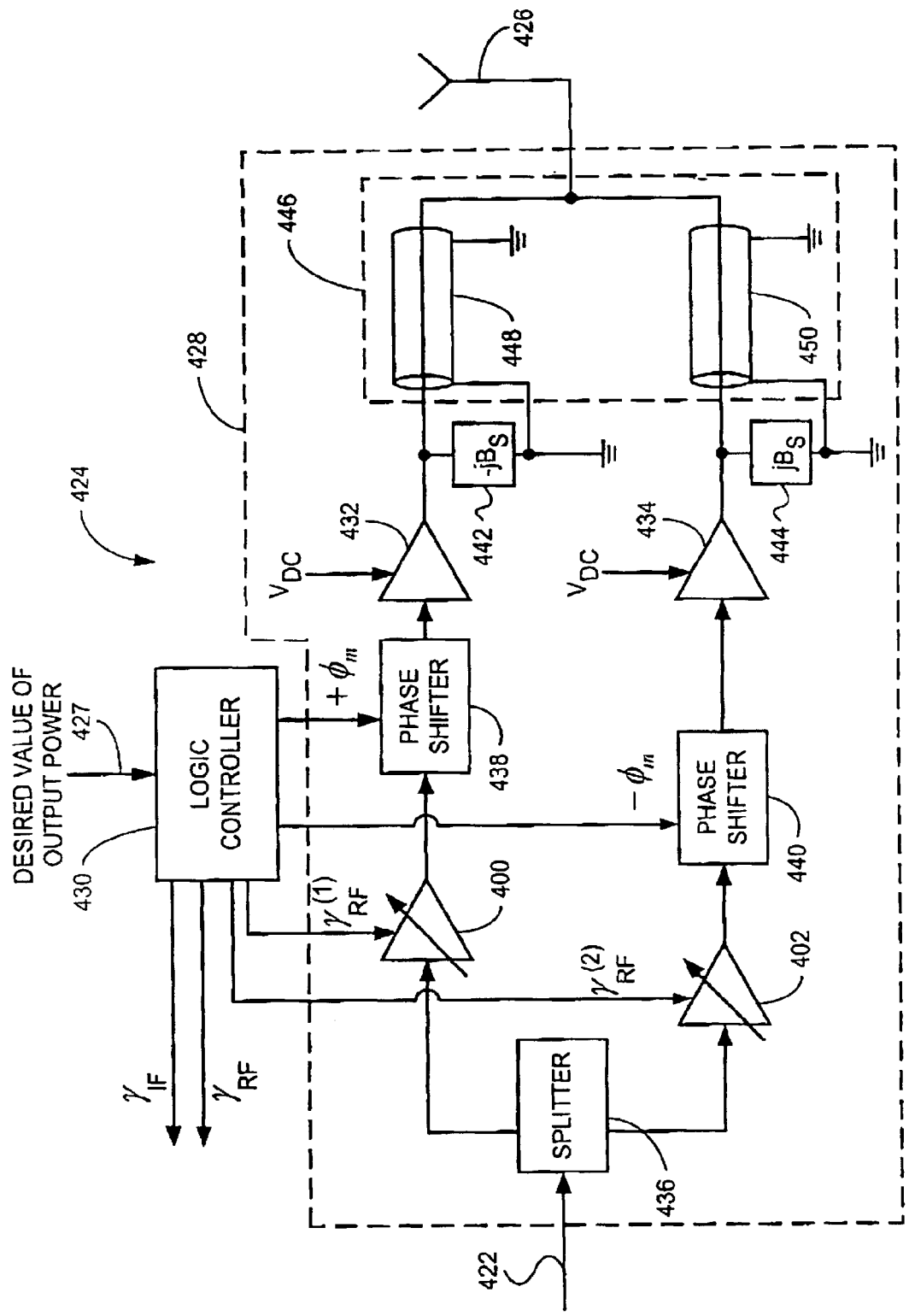
FIG. 4 is a schematic illustration of a further exemplary power amplifier, according to an embodiment of the invention.

Reference is now made to FIG. 4, which is a schematic illustration of a further exemplary power amplifier, according to an embodiment of the invention. A power amplifier 424 receives an input RF signal 422 and amplifies it for transmission by an antenna 426. Power amplifier 424 comprises an outphasing system 428 with shunt reactance and a logic controller 430.

Outphasing system 428 comprises two branch amplifiers 432 and 434 connected in parallel and a splitter 436 for splitting RF signal 422, so that a signal with half the input power is provided to branch amplifier 432 and a signal with half the input power is provided to branch amplifier 434. Branch amplifiers 132 and 134 are driven by a DC input voltage $V_{DC}$. Outphasing system 428 also comprises phase shifters 438 and 440 for modifying the phase of RF signal 422 provided to branch amplifiers 432 and 434, respectively. Outphasing system 428 includes shunt reactance elements 442 and 444 at the output of branch amplifiers 432 and 434, respectively. $B_S$ is the shunt reactance of element 442 and –$B_S$ is the shunt reactance of element 444. Through proper selection of the shunt reactance $B_S$, the efficiency may be improved at a specific output power.

Outphasing system 428 also comprises a transmission-line-coupler 446 for combining the outputs of branch amplifiers 432 and 434. Transmission-line-coupler 446 comprises two transmission lines 448 and 450, each of which serves as an impedance inverter connected to antenna 426 so that the sum of the branch currents goes through the load. Other combiner schemes yielding the same performance could be implemented instead, namely Hybrid BALUN or center tap inductor.

Outphasing system 428 is similar to outphasing system 128 of FIG. 1B, with a difference that outphasing system 428 further comprises at least one RF preamplifier 400 between splitter 436 and phase shifter 438 and at least one RF preamplifier 402 between splitter 436 and phase shifter 440. At least one of RF preamplifier 400 may have a variable gain $y_{RF}^{(1)}$ and at least one of RF preamplifier 402 has variable gain $y_{RF}^{(2)}$, Logic controller 430 sets the gain for each of RF preamplifier 400 and RF preamplifier 402 separately in order to improve the efficiency of outphasing system 428.

Power amplifiers may have a bias current in order to preserve its linearity. The consumption of bias current may decrease the efficiency of the power amplifier. At high output powers, this decrease in efficiency may be relatively unimportant. However, at low output powers, the loss in efficiency is significant. Bias control is the act of adjusting the bias current in order to increase the efficiency of the power amplifier, and is known in the art.

According to another aspect of the present invention, the internal bias current of a power amplifier comprising an outphasing system with shunt reactance may be reduced at low output powers, where the power amplifier may be more linear. This may affect the linearity of the power amplifier, but it may also improve the efficiency.

Figure 5:
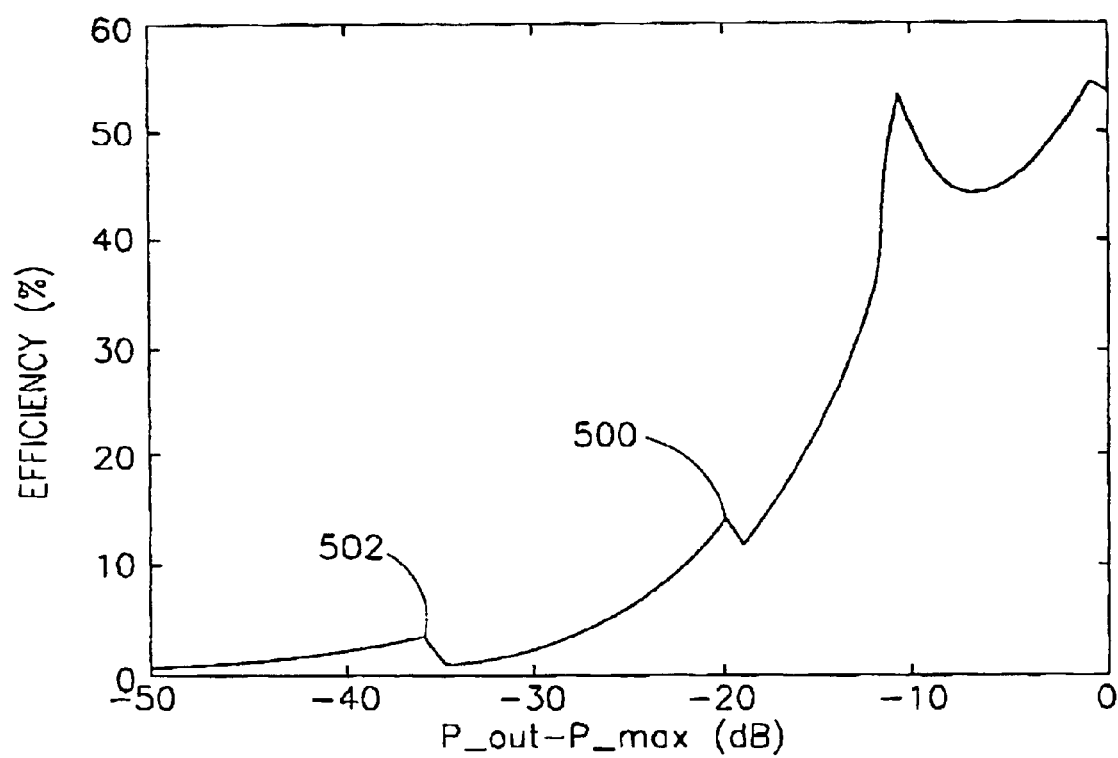
FIG. 5 is a graphical illustration of the efficiency η of the RF transmitter of FIGS. 1A and 1B as a function of the normalized output power, when bias control is performed at two output powers, according to an embodiment of the invention.

Reference is now made to FIG. 5, which is a graphical illustration of the efficiency η of the RF transmitter of FIGS. 1A and 1B as a function of the normalized output power, when bias control is performed. Bias control is performed at two output powers, indicated by peaks 500 and 502. By comparing the graph of FIG. 5 with that of FIG. 2A, it can be seen that bias control may improve the efficiency of the RF transmitter of FIGS. 1A and 1B at low output powers.

As explained hereinabove, the branch amplifiers of an outphasing system with shunt reactance are driven by a direct current (DC) input voltage, provided for example by a battery in the transmitter. It is known in the art that at low output powers, reducing the DC input voltage improves the efficiency of the branch amplifiers without significantly damaging the linearity. By reducing the supply voltage of the branch amplifiers 132 and 134 of FIG. 1B and 432 and 434 of FIG. 4, the efficiency of the outphasing system is improved at the output power range below P1.

According to another aspect of the present invention, the DC input voltage of the branch amplifiers for an outphasing system with shunt reactance is reduced at the output power range below P1.

It will be appreciated by persons of ordinary skill in the art that the present invention is not limited by what has been particularly shown and described herein above. Rather the scope of the invention is defined by the claims that follow:

What is claimed is:

1. A method comprising:
varying the power of an input signal to an outphasing system at a first range of output power values; and
adjusting a phase of said outphasing system at a second range of output power values.

2. The method of claim 1, wherein said outphasing system has shunt reactance.

3. A method comprising:
varying the power of an input signal to a power amplifier when a desired output power is below a threshold; and
performing outphasing when said desired power is at said threshold and above said threshold.

4. A method comprising:
providing a first method of power control in a radio frequency power amplifier for a desired output power at a first range of power values which is below a threshold; and
providing a second method of power control in said power amplifier for a desired output power at a second range of power values which is above or at said threshold.

5. A method comprising:
providing a first method of power control in a radio frequency power amplifier for a desired output power at a first range of power values which is below a threshold; and
providing a second method of power control in said power amplifier for a desired output power at a second range of power values which is above or at said threshold,
wherein said first method is reducing the power of an input signal to said power amplifier and said second method is outphasing.

6. The method of claim 5, wherein said outphasing is setting at least one phase value from a collection of discrete phase values.

7. The method claim 6, wherein said outphasing is setting at least one phase value from a collection of discrete phase values.

8. A method comprising:
providing a first method of power control in a radio frequency power amplifier for a desired power at a first range of power values which is below a threshold; and
providing a second method of power control in said power amplifier for a desired output power at a second range of power values which is above or at said threshold,
wherein said first method is reducing the power of an input signal to said power amplifier and said second method is outphasing and reducing the power of the input signal.

9. A method comprising:
modifying the amplitude of an input signal to an outphasing system having shunt reactance.

10. The method of claim 9, wherein said outphasing system is coupled to at least one of a radio frequency (RF) preamplifier and to an intermediate frequency (IF) amplifier and said modifying comprises:
adjusting a gain of at least one of said RF preamplifier and said IF amplifier.

11. A method comprising:
modifying the amplitude of input to at least one of two branch amplifiers of an outphasing system having shunt reactance.

12. The method of claim 11, wherein a first of said two branch amplifiers is coupled to a first radio frequency preamplifier and a second of said two branch amplifiers is coupled to a second radio frequency preamplifier and said modifying comprises:
adjusting a gain of said first radio frequency preamplifier and adjusting a gain of said second radio frequency preamplifier.

13. A method comprising:
modifying the input to an outphasing system having shunt reactance; and
performing bias control in said outphasing system.

14. The method of claim 13, wherein said performing comprises:
reducing an internal bias current of at least one branch amplifier in said outphasing system.

15. The method of claim 13, wherein said performing comprises:
reducing a supply voltage of at least one branch amplifier in said outphasing system.

16. A radio frequency (RF) power amplifier comprising:
a controller coupled to an outphasing system to provide a variation of the power of an input signal to said outphasing system at a first range of output power values and to provide an adjustment of a phase of the outphasing system at a second range of output power.

17. The RF power amplifier of claim 16, wherein said outphasing system further comprises a shunt reactance.

18. A radio frequency (RF) power amplifier comprising:
a controller coupled to an outphasing system to provide a variation of the power of an input signal to said outphasing system when a desired output power is below a threshold and said controller performs outphasing when said desired output power is at said threshold and above said threshold.

19. The RF power amplifier of claim 18, wherein said outphasing system further comprises a shunt reactance and at least two phase shifters and wherein said controller is coupled to said phase shifters to provide each of said phase shifters with a phase value.

20. The RF power amplifier of claim 19, wherein said outphasing system has a peak efficiency at an upper power and at a lower power, wherein said threshold is said lower power.

21. The RF power amplifier of claim 19, wherein said outphasing system is coupled to at least one of a radio frequency (RF) preamplifier and to an intermediate frequency (IF) amplifier and said controller is coupled to at least one of said RF preamplifier and said IF amplifier to provide an adjustment of a gain of said at least one of said RF preamplifier and said IF amplifier.

22. The RF power amplifier of claim 18, wherein said outphasing system comprises at least two phase shifters and said controller is coupled to said at least two phase shifters to provide a collection of discrete phase values to said at least two phase shifters.

23. The RF power amplifier of claim 22, wherein said outphasing system comprises a shunt reactance and has a peak efficiency at an upper power and at a lower power, wherein said threshold is said lower power.

24. The RF power amplifier of claim 22, wherein the outphasing system is coupled to at least one of a radio frequency (RF) preamplifier and an intermediate frequency (IF) amplifier and said controller is coupled to at least one of said RF preamplifier and said IF amplifier to provide an adjustment of a gain of at least one of said RF preamplifier and IF amplifier.

25. A radio frequency (RF) power amplifier comprising:
a controller coupled to at least one of a radio frequency (RF) preamplifier and an intermediate frequency (IF) amplifier and to an outphasing system having shunt reactance to provide a modification of the amplitude of an input signal to said outphasing system.

26. The RF power amplifier of claim 25, wherein said outphasing system comprises:
a splitter coupled to at least two RF preamplifiers;
at least two phase shifters each coupled to a respective one of said at least two RF preamplifiers; and
at least two branch amplifiers each coupled to a respective one of said at least two phase shifters;
wherein said controller is coupled to at least one of said at least two RF preamplifiers to provide a gain modification of said at least one of said at least two RF preamplifiers.

27. A radio frequency (RF) power amplifier comprising:
an outphasing system having shunt reactance coupled to a controller wherein said controller is coupled to said outphasing system to provide a modification of an input signal to said outphasing system and to perform bias control in said outphasing system.

28. The RF power amplifier of claim 27, wherein said outphasing system comprises at least one branch amplifier and said controller is coupled to said outphasing system to reduce an internal bias current of said at least one branch amplifier.

29. The RF power amplifier of claim 27, wherein said outphasing system comprises at least one branch amplifier and said controller is coupled to said outphasing system to reduce a supply voltage of said at least one branch amplifier.

30. A method comprising:
when a desired output power is below a threshold, setting a variable phase of an outphasing system having shunt reactance to a fixed value and reducing the power of an input signal to a power amplifier including said outphasing system; and
performing outphasing when said desired output power is at said threshold and above said threshold.

31. The method of claim 30, wherein said outphasing system has a peak efficiency at an upper power at a first value of said variable phase and at a lower power at a second value of said variable phase, wherein said threshold is said lower power and said fixed value is said second value.

32. The method of claim 30, wherein said outphasing system is coupled to at least one of a radio frequency (RF) preamplifier and to an intermediate frequency (IF) amplifier and reducing the power of the input signal comprises:
lowering a gain of at least one of said RF preamplifier and said IF amplifier.

33. The method of claim 30, wherein said variable phase is a collection of discrete phase values.

34. The method of claim 33, wherein said outphasing system has a peak efficiency at an upper power at a first value of said variable phase and at a lower power at a second value of said variable phase, wherein said threshold is said lower power and said fixed value is said second value.

35. The method of claim 33, wherein said outphasing system is coupled to at least one of a radio frequency (RF) preamplifier and to an intermediate frequency (IF) amplifier and reducing the power of the input signal comprises:
lowering a gain of at least one of said RF preamplifier and said IF amplifier.

* * * * *